(12) United States Patent
Chai et al.

(10) Patent No.: US 8,455,895 B2
(45) Date of Patent: Jun. 4, 2013

(54) LED-BASED LIGHT SOURCE UTILIZING ASYMMETRIC CONDUCTORS

(75) Inventors: Yan Chai, Fremont, CA (US); Calvin B. Ward, Castro Valley, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/941,799

(22) Filed: Nov. 8, 2010

(65) Prior Publication Data
US 2012/0112215 A1 May 10, 2012

(51) Int. Cl.
*H01L 33/00* (2010.01)
(52) U.S. Cl.
USPC .......... 257/98; 257/E33.072; 438/27
(58) Field of Classification Search
USPC .......... 257/89, 81, 82, 91, 98, 99, 100, 116, 257/117, 432–437, 749, E33.056–E33.059, 257/E25.032, E33.072; 438/27
See application file for complete search history.

(56) References Cited

U.S. PATENT DOCUMENTS

| | | | |
|---|---|---|---|
| 6,576,488 B2 * | 6/2003 | Collins et al. | 438/29 |
| 6,965,361 B1 * | 11/2005 | Sheats et al. | 345/82 |
| 7,344,902 B2 | 3/2008 | Basin et al. | |
| 7,352,011 B2 | 4/2008 | Smits et al. | |
| 7,452,737 B2 | 11/2008 | Basin et al. | |
| 7,815,338 B2 | 10/2010 | Siemiet al. | |
| 7,858,408 B2 | 12/2010 | Mueller et al. | |
| 7,926,975 B2 | 4/2011 | Siemiet et al. | |
| 7,938,562 B2 | 5/2011 | Ivey et al. | |
| 7,946,729 B2 | 5/2011 | Ivey et al. | |
| 2008/0157114 A1 | 7/2008 | Basin et al. | |
| 2010/0072495 A1 * | 3/2010 | Yamazaki | 257/89 |
| 2011/0057205 A1 * | 3/2011 | Mueller et al. | 257/84 |
| 2011/0069490 A1 | 3/2011 | Liu | |

OTHER PUBLICATIONS

International Search Report, PCT/US2011/051607 dated Apr. 10, 2012.

* cited by examiner

*Primary Examiner* — Tony Tran
(74) *Attorney, Agent, or Firm* — Calvin B. Ward

(57) ABSTRACT

A light source and method for making the same are disclosed. The light source includes a plurality of surface mount LEDs that are bonded to a mounting substrate by a layer of asymmetric conductor. Each LED has surface mount contacts on a first surface thereof and emits light from a second surface thereof that is opposite the first surface. The mounting substrate includes a top surface having a plurality of connection traces. Each connection trace includes an n-trace positioned to underlie a corresponding one of the n-contacts and a p-trace positioned to underlie a corresponding one of the p-contacts, the p-trace having an area greater than the p-contact. The layer of asymmetric conductor is sandwiched between the surface mount contacts and the connection traces, and can optionally extend into the spaces between the LEDs to provide a scattering medium for redirecting light leaving the sides of the LEDs.

8 Claims, 7 Drawing Sheets

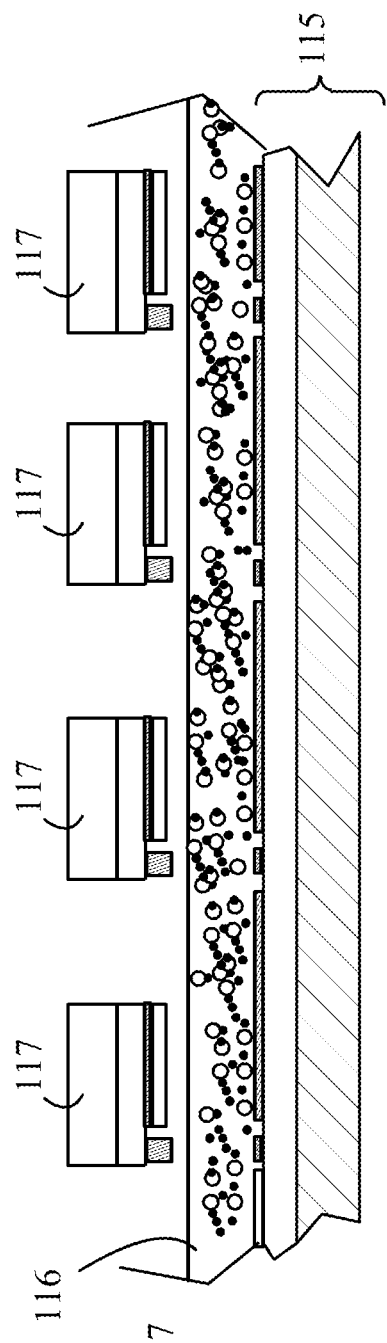
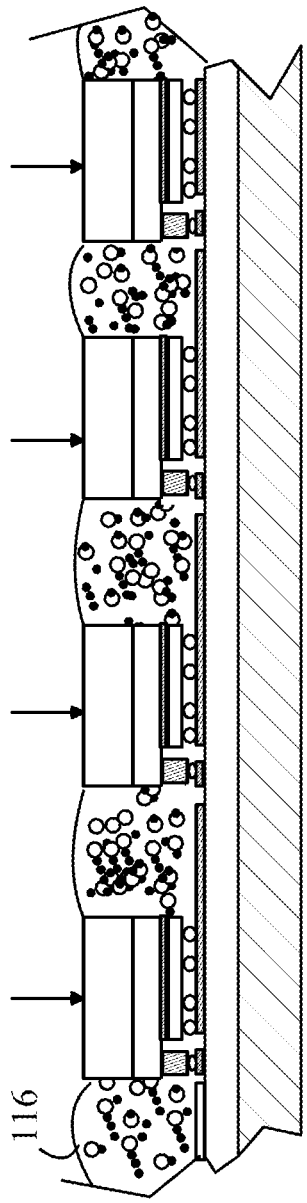
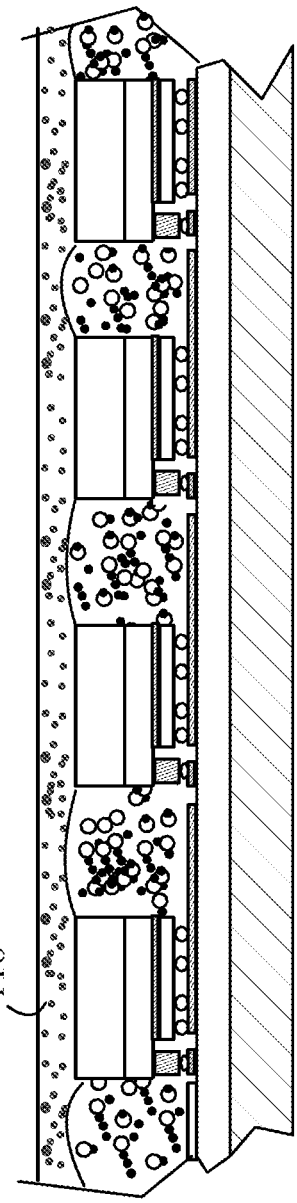
FIGURE 7
FIGURE 8
FIGURE 9

US 8,455,895 B2

LED-BASED LIGHT SOURCE UTILIZING ASYMMETRIC CONDUCTORS

BACKGROUND OF THE INVENTION

Light emitting diodes (LEDs) are an important class of solid-state devices that convert electric energy into light. Improvements in these devices have resulted in their use in lighting fixtures as replacements for conventional incandescent and fluorescent light sources. LEDs have significantly longer lifetimes than both incandescent bulbs and fluorescent tubes. In addition, the energy conversion efficiency of LEDs has now reached the same level as that obtained in fluorescent light fixtures and promises to exceed even these efficiencies.

A single LED produces too little light to be used as a replacement for a conventional lighting source in most applications. Hence, a replacement light source must utilize a large number of individual LEDs. The packaging costs and reliability problems that result from having to use large numbers of individual LEDs present challenges that must be overcome if LED-based light sources are to reach their full potential as replacements for conventional light sources.

SUMMARY OF THE INVENTION

The present invention includes a light source and method for making the same. The light source includes a plurality of surface mount LEDs that are bonded to a mounting substrate by a layer of asymmetric conductor. Each LED has surface mount contacts on a first surface thereof and emits light from a second surface thereof that is opposite the first surface. The surface mount contacts include a p-contact and an n-contact for powering that LED. Each LED is characterized by an active layer that generates light of a predetermined wavelength, the p-contact having an area that is greater than or equal to at least half of the active region in the LED. The mounting substrate includes a top surface having a plurality of connection traces. Each connection trace includes an n-trace positioned to underlie a corresponding one of the n-contacts and a p-trace positioned to underlie a corresponding one of the p-contacts, the p-trace having an area greater than the p-contact. The layer of asymmetric conductor is sandwiched between the surface mount contacts and the connection traces.

In one aspect of the invention, the LEDs are spaced apart from one another and the LEDs emit light from side surfaces of the LEDs. The asymmetric conductor is present in spaces between the LEDs to a height such that light leaving the side surfaces of the LEDs enters the asymmetric conductor located between the LEDs. The asymmetric conductor includes scattering particles that scatter the light leaving the side surfaces.

BRIEF DESCRIPTION OF THE DRAWINGS

FIGS. 7-9 are cross-sectional views of a portion of a light source according to one embodiment of the present invention at various stages in the fabrication process.

DETAILED DESCRIPTION OF THE PREFERRED EMBODIMENTS OF THE INVENTION

Figure 1:
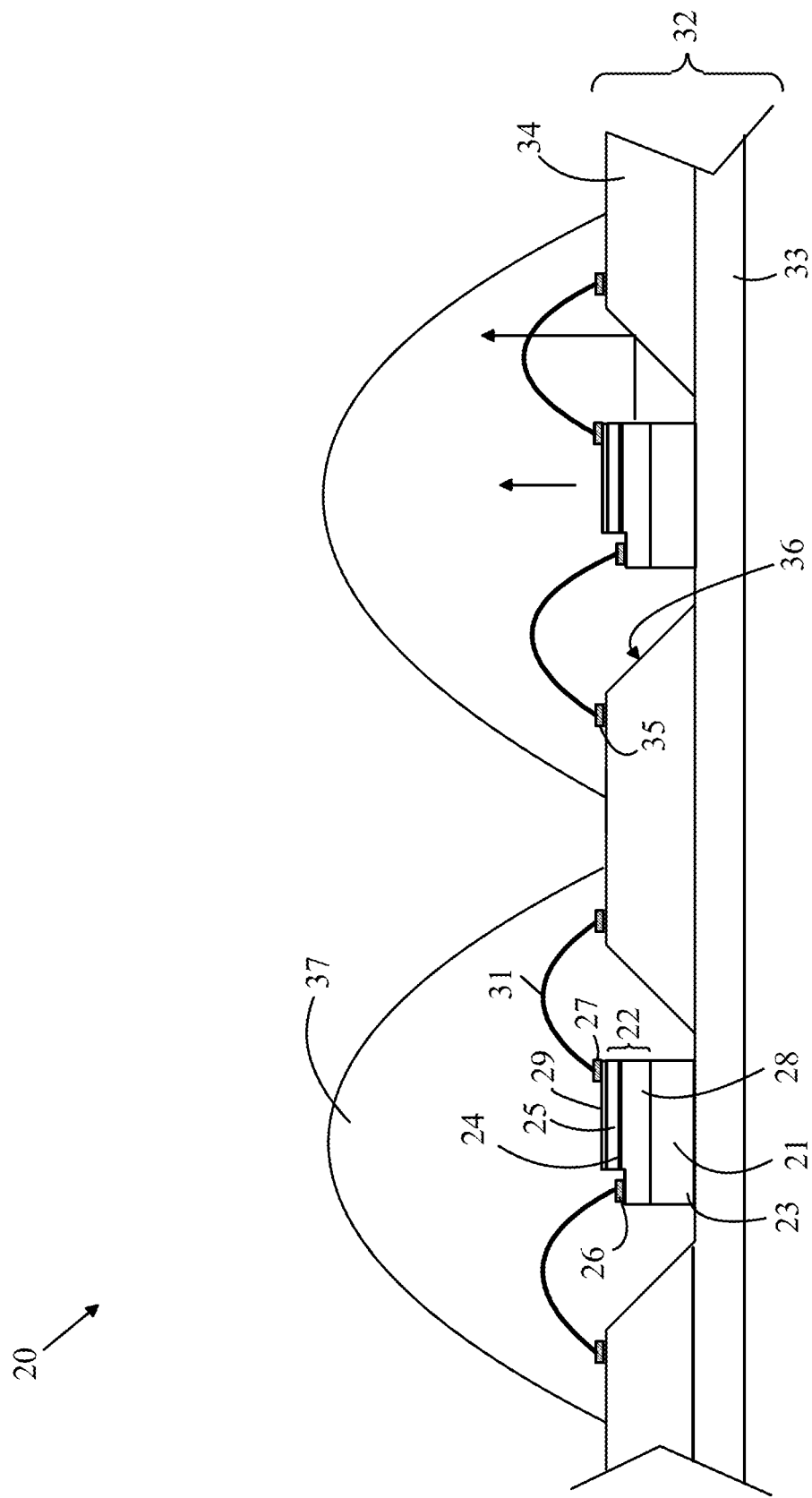
FIG. 1 is a cross-sectional view of a portion of a prior art, phosphor-converted, LED light source.

The manner in which the present invention provides its advantages can be more easily understood with reference to FIG. 1, which is a cross-sectional view of a portion of a prior art, phosphor-converted, LED light source. Light source 20 includes a plurality of LEDs of which LED 21 is typical. The LEDs are mounted on a printed circuit board 32 that includes a heat-spreading layer 33, an insulating layer 34, and conducting layer that is patterned to provide electrical conductors such as conductor 35. The LEDs are mounted in depressions having reflecting walls 36 that re-direct light leaving the side surfaces of the LEDs such that the light leaves the light source in the vertical direction as shown by the arrows. The surface of heat-spreading layer 33 is typically covered with a reflecting material that redirects any light that is emitted in a downward direction into the upward direction. The LEDs are covered by a layer of phosphor 37 that converts a portion of the blue light generated by the LEDs to light in the yellow region of the optical spectrum. The combination of the blue and yellow light is perceived as "white" light by a human observer.

The LEDs include a light emitting structure 22 that is deposited on a sapphire substrate 23. The light-emitting structure can be viewed as an active layer 24 that is sandwiched between an n-type GaN layer 28 that is deposited on substrate 23 and a p-type GaN layer 25 that is deposited over the active layer. The device is powered from contacts 26 and 27. Since p-type GaN has a very high resistivity, a current spreading layer 29 is typically deposited on the surface of layer 25. In the arrangement shown in FIG. 1, light is extracted through the top surface of the LED, and hence, the current spreading layer must be transparent. Typically, indium tin oxide (ITO) is used for the current spreading layer.

The electrical connections to the LEDs are provided by wire bonds such as bond 31 that connect the contacts on the LEDs to corresponding contacts on a printed circuit board. The wire bonds present problems in terms of fabrication cost and reliability, particularly when the light source includes a large number of individual dies. The wire bonds are subject to failure both at the time of initial implementation of the bonds and later due to stresses between the phosphor layer and the encapsulated wire bonds. In addition, the wire bonds block a significant fraction of the light leaving the LEDs, as both the bond pads and the gold wire absorb light.

The arrangement shown in FIG. 1 provides good light capture with respect to the light leaving the sides of the LEDs. However, this aspect requires a more complex mounting substrate having reflective cups. The cost of the substrate increases the cost of the light source.

The arrangement shown in FIG. 1 has the advantage of providing good heat conduction, since the entire bottom surface of the LEDs is in contact with the heat-spreading layer 33 of the printed circuit board. Heat removal is an important aspect of high-powered LED light sources, as the efficiency of the LEDs decreases with temperature. In addition, mechanical problems that arise from differences in the thermal coefficient of expansion between phosphor layer 37 and printed circuit board 32 become worse as the operating temperature increases.

Figure 2:
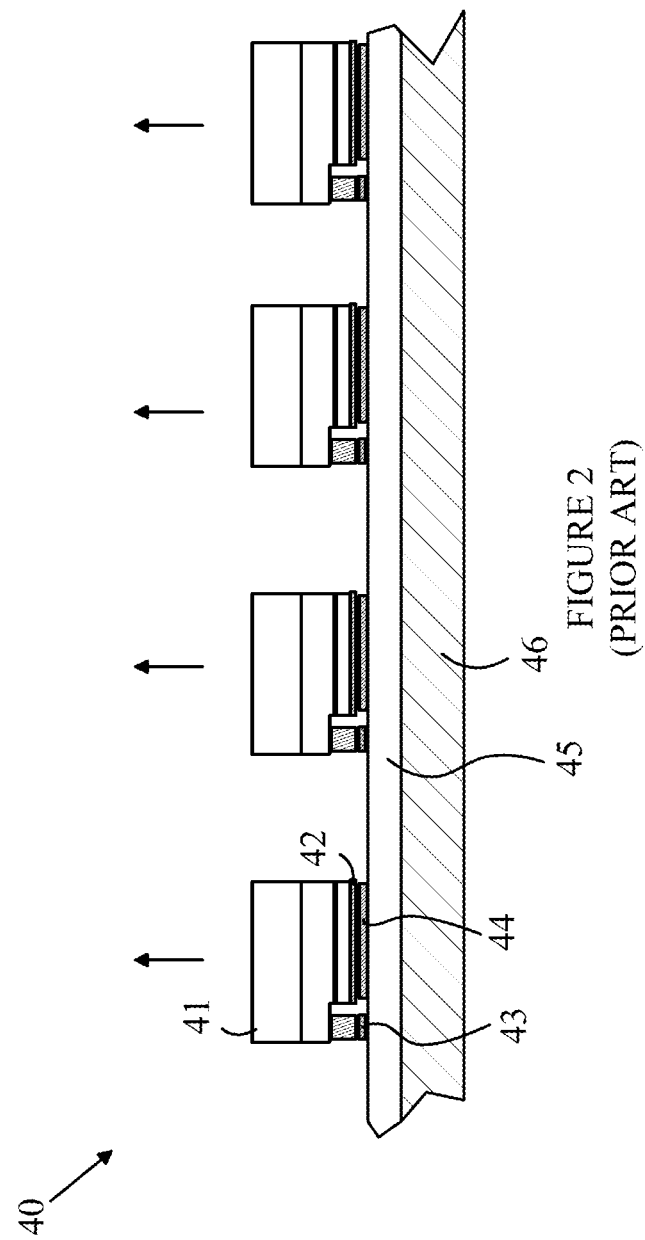
FIG. 2 is a cross-sectional view of a portion of another prior art light source.

The problems associated with wire bonds can be reduced by utilizing a flip-chip mounting scheme. Refer now to FIG. 2, which is a cross-sectional view of a portion of another prior art light source. Light source 40 includes a plurality of surface mounted LEDs. For the purposes of this discussion, a surface mounted LED is defined to be an LED in which both the p-contact and the n-contact are on one side of the LED, light being emitted primarily through an opposing surface of the LED, although some of the light may be emitted through the side surfaces of the LED. In the case shown in FIG. 2, the sapphire substrate 41 faces upward and the LEDs are connected to the mounting substrate by the contacts that are used to power the LEDs. Light is emitted through the sapphire substrate. The p-contact includes a mirror 42 that re-directs light striking the contact such that the light exits through the sapphire substrate or side surfaces of the LED. The mirror can also act as the current spreading layer thereby reducing or eliminating the need to use an ITO layer. While the ITO layer is not needed for current spreading in this arrangement, the ITO layer can still provide an ohmic contact with the p-GaN layer, and hence, a thin ITO layer may be included in the p-contact. Since light does not exit through the p-GaN layer, the p-contact can extend substantially over the entire active layer and hence, the problems of providing current spreading over the highly resistive p-GaN layer are substantially reduced. For the purposes of this discussion, the p-contact will be defined to extend over substantially all of the active layer if the p-contact overlies at least 60 percent of the active layer.

The n-contact and p-contact are bonded to corresponding traces 43 and 44, respectively, on the mounting substrate. These traces are patterned on an insulating layer 45 that overlies the heat-dissipating core region 46 of the printed circuit board. Suitable bonding materials that utilize solder, thermal compression bonding, or asymmetric conducting adhesives are known to the art. The asymmetric adhesives will be discussed in more detail below.

While the arrangement shown in FIG. 2 reduces the problems associated with the wire bonds, heat dissipation and the loss of light that exits through the sidewalls of the LEDs remains problematic. If the LEDs are mounted in reflective cups as described above, the cost of the substrate becomes a problem. Furthermore, the bonding process requires that the LEDs be pressed against the printed circuit board during the bonding process, and hence, providing a pressure mechanism that can operate on all of the LEDs in a light source at once is problematic if the LEDs are in reflective cups.

The cups can be eliminated if the regions betweens the LEDs are filled with a transparent material that includes scattering particles and the surface of the mounting substrate between the LEDs is reflective. In this case, the light leaving the sides of the LEDs will be scattered until it either leaves the light source in a generally upward direction or is absorbed after multiple reflections. While re-direction of light by scattering is less efficient than embodiments that utilize cups or other reflectors, the reduced cost of fabrication often is more important, as additional LEDs can be added to the array to makeup for light losses. While this mode of light re-direction does not require reflective cups, the process does require a separate deposition step in which scattering material is introduced between the LEDs. If the LEDs are in a closely packed array, this injection of material between the LEDs presents challenges.

Heat dissipation requires a low thermal resistance path from the LED to the underlying core region 46 and a low thermal resistance path from core region 46 to the structure that finally transfers the heat to the environment, typically at an air interface. If either of these paths presents a large thermal resistance, the LEDs will be forced to operate at elevated temperatures to drive the heat along the resistive path. Typically, GaN LEDs are designed to operate at temperatures below 100° C. or 75° C. above ambient. In one aspect of the invention, the thermal paths from the LEDs to the final heat-radiating structure that transfers the heat to the environment are dimensioned such that the heat generated in the LEDs can be transferred to the environment without requiring the LEDs to be operated at a temperature that is greater than 75° C. above the temperature of the environment in question.

The path from the LEDs to the region 46 has two potential bottlenecks. The first is the connection between the p-contact and the underlying electrical trace, i.e., trace 44. The second is the thermal path from trace 44 to core 46. Except in the case of an asymmetric conducting adhesive, the first bottleneck is not potentially limiting, since solder or direct bonding leads to metal-metal bonds having a thermal conductivity that is greater then that of the LED materials. The second bottleneck presents more significant problems, since traces must be insulated from the underlying heat-dissipating core, and the insulating layers used in printed circuit boards also have high thermal resistance.

Figure 3:
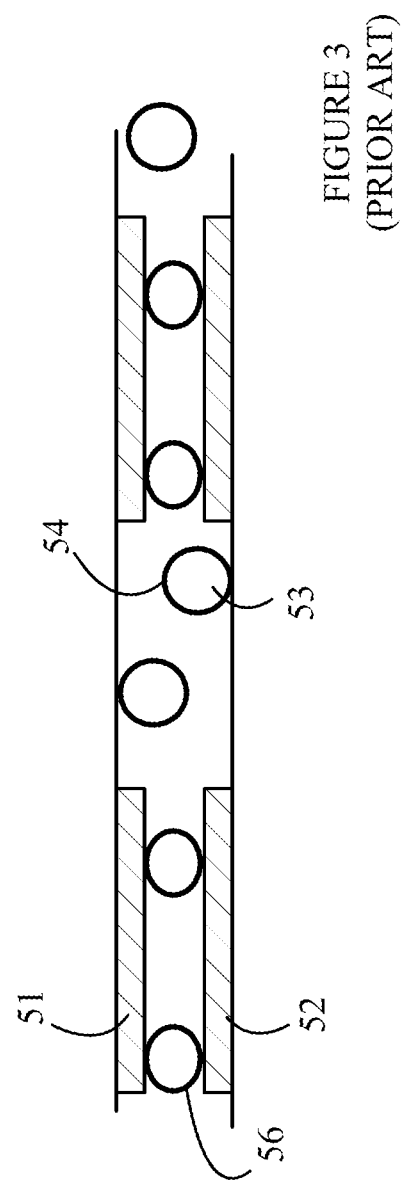
FIG. 3 is a cross-sectional view of a pair of surfaces that are bonded by an asymmetric conductor.

In one aspect of the present invention, an asymmetric conductor that has been modified to provide light scattering as well as vertical connections is utilized. The manner in which asymmetric conductors operate can be more easily understood with reference to FIG. 3, which is a cross-sectional view of a pair of surfaces that are bonded by an asymmetric conductor. The asymmetric conductor includes a plurality of elastic metal coated spheres 53 that are suspended in a curable epoxy or other insulating carrier material that can be converted to a solid by a curing process. Each of the spheres is coated with a metallic layer 54 that renders the sphere a conductor. When a layer of this material is pressed between two surfaces as shown in FIG. 3, the spheres that are trapped between conductors 51 and 52 are deformed as shown at 56. The deformed spheres make electrical connections between electrodes 51 and 52. After the carrier medium is cured, the two surfaces are left bonded to one another with opposing conductors on the surfaces being electrically connected to one another. The density of the sphere is chosen to be high enough to assure that any pair of opposing conductors has one or more spheres trapped therebetween but low enough to assure that the spheres do not contact one another in the horizontal direction and form a laterally running conduction path.

Asymmetric conductors have been used for bonding arrays of LEDs to underlying substrates having switching circuitry therein for over a decade. For example, U.S. Pat. No. 6,965,361 teaches a display in which a layer that includes an array of organic LEDs is bonded to a substrate having thin film transistors thereon for switching individual LEDs on and off.

Figure 4:
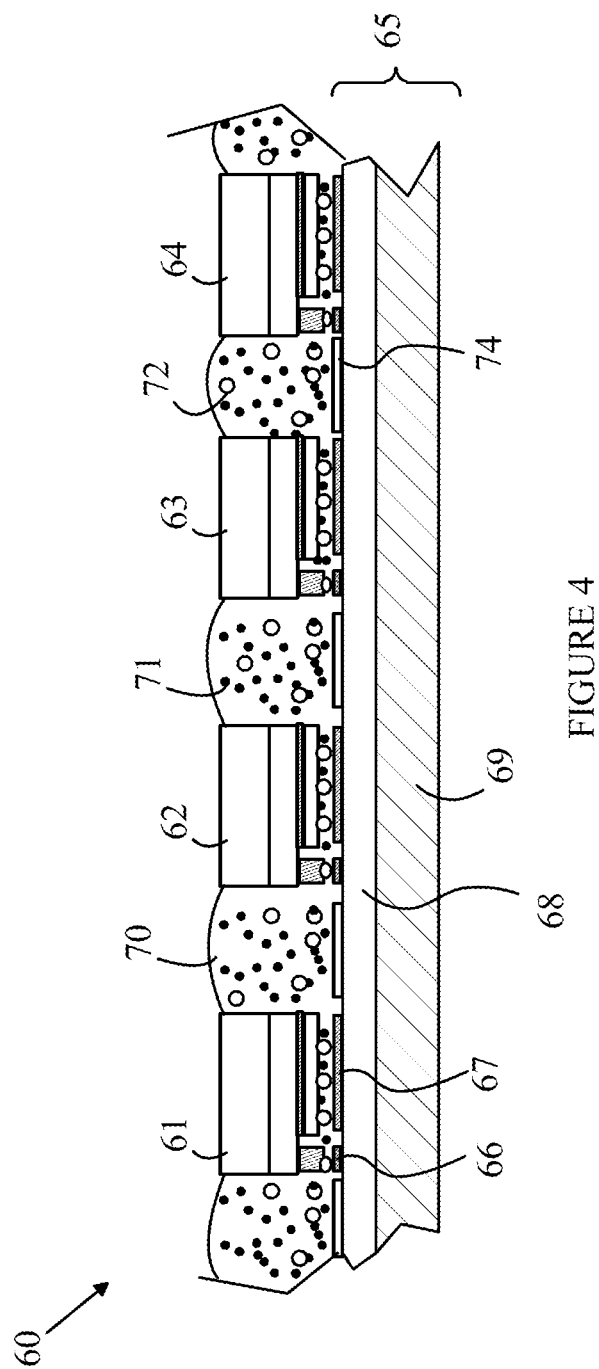
FIG. 4 is a cross-sectional view of a portion of a light source according to one embodiment of the present invention.

Refer now to FIG. 4, which is a cross-sectional view of a portion of a light source according to one embodiment of the present invention. Light source 60 includes a plurality of surface mount LEDs 61-64. The LEDs are bonded to traces on a mounting substrate 65. Exemplary traces are labeled at 66 and 67. The traces are patterned from a metal layer that is deposited on an insulating substrate 68 that is bonded to a heat-dissipating spreading layer 69. Substrate 68 will be discussed in more detail below.

The LEDs are bonded to the traces by an asymmetric adhesive layer that includes two types of particles that are suspended in an insulating carrier material. The first type of particle is shown at 72 and consists of a compressible polymer sphere with an outer metal coating that operates in a manner analogous to that described above with reference to spheres 53. The second class of particles consists of light reflecting particles 71 that scatter light striking the particles. In one aspect of the present invention, these particles are insulating particles such as $TiO_2$. The scattering particles have diameters that are significantly less than those of the conducting spheres to assure that the scattering particles do not interfere with the compression of the spheres between the surfaces that are to be connected electrically. For example, the scattering particles can have diameters that are less than the minimum distances between the electrodes of the LEDs and the corresponding traces on layer 68. It should be noted that the scattering particles preferably have diameters that are greater than the wavelength of light generated by the LEDs. In one aspect of the invention, the light scattering particles have a maximum dimension that is less than half the diameter of the compressible spheres when the compressible spheres are not deformed by being sandwiched between the conductors.

In one aspect of the invention, the LEDs are pressed into a layer of asymmetric adhesive while the carrier material is in a liquid state. The layer of material has a thickness that is sufficient to assure that when all of the LEDs are pressed into the layer, the excess material will be forced into the spaces between the LEDs to a height that assures that the edges of the LEDs are covered by an asymmetric conductor as shown at 70 such that light leaving the side walls of the LEDs enters the layer of asymmetric conductor between the LEDs and is scattered by the scattering particles. For example, the thickness of the pre-cured asymmetric conductor medium can be set such that the height of the asymmetric conductor medium between the LEDs is sufficient to ensure that at least 50, 60, 70, 80, or 90 percent of the light leaving the side surfaces of the LEDs enters the asymmetric conductor medium between the LEDs.

In one aspect of the invention, the top surface of layer 68 includes reflective regions such as region 74 that reflect any light that is scattered downward back into an upward direction. These reflective regions could be separate reflective areas that are not connected to other structures or reflective extensions of the p-contacts.

The conducting spheres can also act as scattering particles provided the metallic coating is chosen from a material that provides a good mirror. In this regard, it should be noted that highly conductive metals such as gold and silver will only provide a good mirror surface if the surface is free of roughness. If the surface is not sufficiently smooth, particles will absorb light via the surface plasmon effect. Prior art particles utilize gold or silver for the outer coating to maximize the conductivity of the coating, and hence, do not provide optimal reflective surfaces. In one aspect of the present invention, the conducting particles utilize aluminum as the outer coating to improve the reflectivity of the particles that are trapped between the LEDs.

Heat dissipation is an important issue in high-powered light sources based on LEDs for a number of reasons. First, the efficiency of conversion of electricity to light decreases at high temperatures. Second, the lifetimes of the LEDs also decrease with temperature. Third, the differences in thermal coefficient of expansion between the LEDs and the carrier material used in the asymmetric conductor can lead to fractures in the asymmetric conductor and separation of the LEDs from the underlying structure. Hence, maximizing heat transfer from the LEDs to the surrounding environment is an important aspect of any high-power LED light source design.

The heat generated by the LEDs must be transferred either to the air above the LEDs or to heat-spreading layer 69 which is in thermal contact with a heat-dissipating structure that couples the heat to the environment. To transfer the heat to layer 69, the thermal resistance of layer 68 is preferably much less than the thermal resistance of the asymmetric conductor layer between the contacts on the LED and the corresponding traces on layer 68. The thermal resistance of layer 68 can be reduced by using a material that has a low thermal resistance while still providing electrical insulation and by increasing the surface area of layer 68 over which heat is transferred to layer 69, and decreasing the thickness of layer 68.

Since the thickness of the layer of asymmetric conductor between the p-contact on the LED and corresponding trace on layer 68 is very thin, the thermal resistance is determined by the area of contact between the trace and layer 68. As noted above, it is advantageous to provide a reelecting surface 74 between the LEDs. In one aspect of the present invention, this surface is created by extending the traces opposite the p-contacts on the LEDs, which will be referred to as the p-contact traces. These traces can be coated with an aluminum or other highly reflective coating. The area of the traces can be extended to substantially fill the regions between the LEDs thereby increasing the heat transfer area substantially. The maximum expansion of this area depends on the spacing of the LEDs. In one aspect of the invention, the LEDs are spaced such that the area of the p-traces is at least twice the area of the p-contact on the LEDs.

Figure 5:
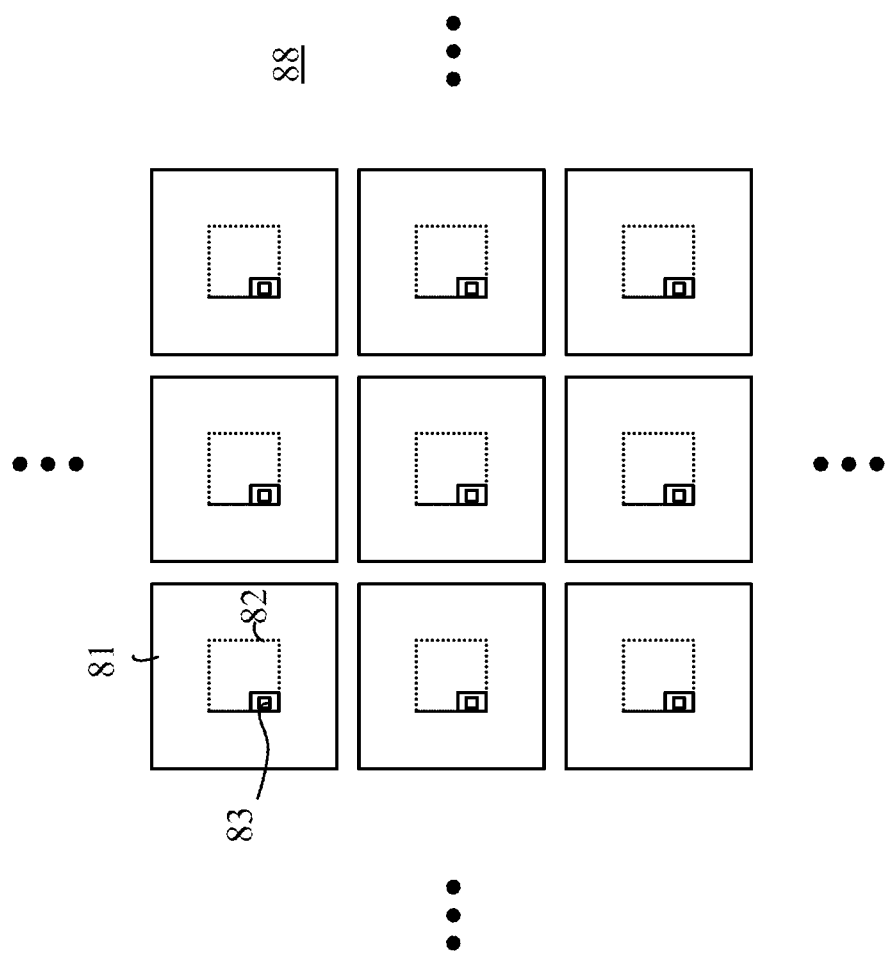
FIG. 5 is a top view of a portion of a mounting substrate before the LEDs have been bonded to the n-traces and p-traces.

Refer now to FIG. 5, which is a top view of a portion of a mounting substrate before the LEDs have been bonded to the n-traces and p-traces. The expanded p-traces are shown at 81. The area in which the LEDs bond is shown in phantom at 82. The n-traces are shown at 83. The electrical connections to the traces on the surface of insulator 88 are made through vias that are under the traces to conducting planes that are in layers under the heat-spreading layer.

Figure 6:
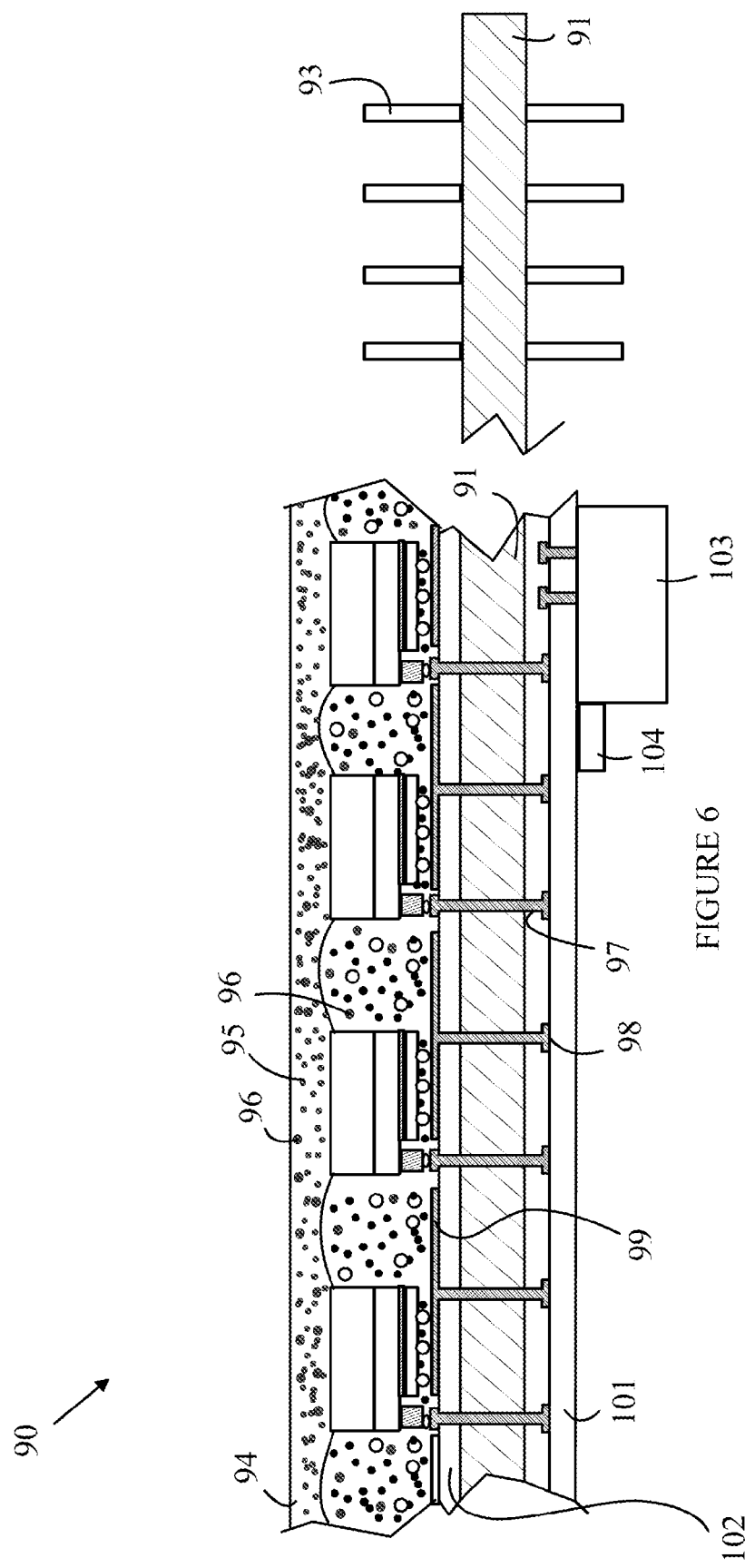
FIG. 6 is a cross-sectional view of a portion of another embodiment of a light source according to the present invention.

Refer now to FIG. 6, which is a cross-sectional view of a portion of another embodiment of a light source according to the present invention. Light source 90 is similar to light source 60 discussed above with reference to FIG. 4 in that light source 90 includes a plurality of LEDs that are bonded to traces on a mounting substrate by an asymmetric conductor. The traces that connect the p-contacts are enlarged as discussed above with respect to FIG. 5. A typical enlarged trace is shown at 99. The traces are connected to a wiring layer 98 by conducting vias 97 that connect each trace to a corresponding conductor on wiring layer 101. These vias pass through insulators in heat-spreading layer 91. Hence, the only high thermal impedance area is the area between the expanded traces on the surface of insulator 102 and heat-spreading layer 91.

Light source 90 also includes a phosphor conversion layer 94 that converts a portion of the light generated by the LEDs to light having a different spectrum that is chosen such that the light leaving layer 94 is perceived to be white light with a predetermined color temperature. The phosphor conversion layer is constructed by suspending phosphor particles 96 in a transparent carrier medium such as an epoxy and then curing the epoxy layer once the suspension has been spread over the light source. Since the areas between the LEDs are filled with the asymmetric conductor, the phosphor conversion layer can be of a more uniform thickness, and hence, color variations resulting from the blue light from the LEDs passing through different areas of phosphor with differences in thickness of phosphor are reduced.

In one aspect of the present invention, phosphor conversion layer 94 is constructed from the same epoxy medium as the asymmetric conductor. In another aspect of the invention, the phosphor conversion layer has a coefficient of thermal expansion that is substantially equal to that of the asymmetric conductor. Here, the two layers will be defined as having substantially equal thermal coefficients of expansion if the difference in thermal coefficients of expansion is less than a difference that would cause the two layers to separate during the thermal cycling of the light source over its design lifetime. This arrangement reduces the problems associated with having different coefficients of thermal expansion associated with different layers.

To further improve the thermal conductivity of the asymmetric conductor and phosphor conversion layers, particles 95 of a high thermal conductivity medium can be included in the layers. For example, particles of diamond, crystalline silicon, or GaN can be included in layer 24 and the asymmetric conductor. These materials have significantly higher thermal conductivity than the epoxy resins used to construct the layers, and hence, their inclusion results in a layer having an average thermal conductivity that is higher than that of the epoxy. These materials are also transparent, and hence, do not absorb the light. The use of such materials is discussed in detail in co-pending U.S. patent application Ser. No. 12/845,104, filed on Jul. 28, 2010, which is hereby incorporated by reference.

As noted above, heat-spreading layer 102 moves the heat generated by the LEDs to a region of the light source that has contact with the environment and can include structures such as the fins shown at 93 that help to dissipate the heat to the surroundings. Typically, the heat is dissipated to the air; however, embodiments in which the heat-spreading layer is in contact with other structures that dissipate the heat can also be constructed.

In the above-discussed embodiments, the thermal resistance of layer 102 presents the most challenges in terms of removing heat from the LEDs. This layer can be constructed from a thin polymeric layer or a thin layer of an insulating material such as glass. Alternatively, layer 102 can constructed from an undoped crystalline material that is grown on heat-spreading layer 91. For example, layers of diamonds can be deposited on a number of substrates at low temperature using chemical vapor deposition or similar techniques. Such coatings are commonly used as scratch resistant coatings on glass or plastics. Similarly, undoped silicon could also be used as the insulator. These crystalline materials have significantly higher thermal conduction than polymeric layers.

In one aspect of the invention, the wiring layer is coupled to a drive circuit 103 that includes a power connector 104 for providing power to the LEDs. The drive circuit can also include switching circuitry that determines the internal connection topography for the array of LEDs.

The manner in which a light source according to one embodiment of the present invention is constructed will now be explained with reference to FIGS. 7-9, which are cross-sectional views of a portion of a light source according to one embodiment of the present invention at various stages in the fabrication process. Initially, a mounting substrate 115 is covered with a layer 116 of the asymmetric conductor in a non-cured liquid state as shown in FIG. 7. Each LED 117 is positioned such that the contacts on the LED are over the corresponding traces on mounting substrate 115. The positioned LEDs are then forced against mounting substrate 115 as shown in FIG. 8. The LEDs can be forced into the layer of the asymmetric conductor one at a time or attached to a temporary carrier and forced into the asymmetric conductor simultaneously. After the LEDs have been forced into the layer of the asymmetric conductor, pressure is applied to the LEDs and the asymmetric conductor material is heated to cure the material, and hence, render the asymmetric conductor layer solid. As noted above, the depth of the uncured asymmetric conductor material is set such that the asymmetric conductor fills the regions betweens the LEDs when the LEDs are forced into the asymmetric conductor material. After the asymmetric conductor material has cured, the layer 118 of phosphor-containing material is deposited over the cured asymmetric conductor layer and cured as shown in FIG. 8.

The above description refers to various surfaces in terms of top or bottom surfaces. These are merely labels that express the relationship of the surfaces as seen in the drawings when the drawings are held in a particular orientation. These labels do not imply any relationship with respect to orientation on the Earth.

The LEDs in the above-described embodiments of the present invention have been described in terms of an active layer that is sandwiched between an n-layer and a p-layer, the various layers being grown on a substrate. However, it is to be understood that each of the layers may include a plurality of sub-layers. Similarly, the substrate may include one or more buffer layers that are deposited prior to depositing the LED layers.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light source comprising:
a plurality of surface mount LEDs on a plurality of separate dies, each LED having surface mount contacts on a first surface thereof and emitting light from a second surface thereof that is opposite said first surface, said surface mount contacts comprising a p-contact and an n-contact for powering that LED, each LED being characterized by an active layer that generates light of a predetermined wavelength;
a mounting substrate comprising a top surface having a plurality of connection traces, each connection trace comprising an n-trace positioned to underlie a corresponding one of said n-contacts and a p-trace positioned to underlie a corresponding one of said p-contacts, said one of said p-contacts being characterized by a p-contact surface area and said p-traces underlying said one of said p-contacts being characterized by a p-trace surface area greater than said p-contact surface area;
a layer of asymmetric conductor sandwiched between said surface mount contacts and said connection traces, said layer covering said top surface of said mounting substrate, wherein said asymmetric conductor comprises deformable conducting particles suspended in a first transparent medium, said deformable conducting particles having a non-deformed diameter, and light scattering particles, said light scattering particles having a dimension greater than said wavelength of light generated by said LEDs and less than half said non-deformed diameter; and wherein said light source further comprises particles of a heat-conducting material suspended in said transparent medium, said particles of said heat-conducting material having a greater thermal conductivity than said transparent medium.

2. The light source of claim 1 wherein said LEDs are spaced apart from one another, said LED also emitting light from side surfaces that are substantially perpendicular to said first and second surfaces and wherein said asymmetric conductor is present in spaces between said LEDs such that light leaving said side surfaces of said LEDs enters said asymmetric conductor located between said LEDs.

3. The light source of claim 1 further comprising a phosphor layer comprising phosphor particles suspended in a transparent carrier material.

4. The light source of claim 3 wherein said transparent carrier material has substantially the same coefficient of thermal expansion as said first transparent medium.

5. The light source of claim 3 wherein said transparent carrier material comprises said first transparent medium.

6. The light source of claim 1 wherein said conducting particles comprise an outer coating having a reflectivity greater than 90 percent.

7. The light source of claim 1 wherein said conducting particles have an outer coating comprising aluminum.

8. A light source comprising:
a plurality of surface mount LEDs each LED having surface mount contacts on a first surface thereof and emitting light from a second surface thereof that is opposite said first surface, said surface mount contacts comprising a p-contact and an n-contact for powering that LED, each LED being characterized by an active layer that generates light of a predetermined wavelength;
a mounting substrate comprising a top surface having a plurality of connection traces, each connection trace comprising an n-trace positioned to underlie a corresponding one of said n- contacts and a p-trace positioned to underlie a corresponding one of said p-contacts, said one of said p-contacts being characterized by a p-contact surface area and said p-trace being characterized by a p-trace surface area greater than said p-contact surface area;
a layer of asymmetric conductor sandwiched between said surface mount contacts and said connection traces, said asymmetric conductor comprising deformable conducting particles suspended in a first transparent medium, said deformable conducting particles having a non-deformed diameter and light scattering particles, said light scattering particles having a dimension greater than said wavelength of light generated by said LEDs and less than half said non-deformed diameter;
wherein said p-trace surface area is greater than twice said p-contact surface area; and
wherein said light source further comprises particles of a heat-conducting material suspended in said transparent medium, said particles of said heat-conducting material having a greater thermal conductivity than said transparent medium.

* * * * *